United States Patent
Guo et al.

(10) Patent No.: US 8,928,828 B2
(45) Date of Patent: Jan. 6, 2015

(54) ARRAY SUBSTRATE, MANUFACTURING METHOD THEREOF, LIQUID CRYSTAL PANEL, AND DISPLAY DEVICE

(75) Inventors: Wei Guo, Beijing (CN); Woobong Lee, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 121 days.

(21) Appl. No.: 13/700,971

(22) PCT Filed: Jul. 20, 2012

(86) PCT No.: PCT/CN2012/078966
§ 371 (c)(1),
(2), (4) Date: Nov. 29, 2012

(87) PCT Pub. No.: WO2013/013599
PCT Pub. Date: Jan. 31, 2013

(65) Prior Publication Data
US 2013/0107155 A1    May 2, 2013

(30) Foreign Application Priority Data

Jul. 22, 2011    (CN) .......................... 2011 1 0207503

(51) Int. Cl.
| | | |
|---|---|---|
| G02F 1/136 | (2006.01) | |
| H01L 33/00 | (2010.01) | |
| H01L 27/15 | (2006.01) | |
| H01L 29/49 | (2006.01) | |
| H01L 29/45 | (2006.01) | |
| H01L 27/12 | (2006.01) | |
| G02F 1/1368 | (2006.01) | |

(52) U.S. Cl.
CPC ............ H01L 27/15 (2013.01); H01L 33/0041 (2013.01); H01L 29/4908 (2013.01); H01L 29/458 (2013.01); H01L 27/124 (2013.01); G02F 1/1368 (2013.01)
USPC .......................................................... 349/43

(58) Field of Classification Search
USPC .......................................................... 349/43
See application file for complete search history.

(56) References Cited

U.S. PATENT DOCUMENTS 6,433,842 B1 *  8/2002  Kaneko et al. .................. 349/43
7,462,516 B2 * 12/2008  Ahn .............................. 438/149

(Continued)

FOREIGN PATENT DOCUMENTS

| CN | 1909248 A | 2/2007 |
|---|---|---|
| CN | 1034687 A | 3/2007 |
| CN | 1934687 A | 3/2007 |
| CN | 101075579 A | 11/2007 |
| CN | 101236897 A | 8/2008 |
| CN | 100470757 A | 3/2009 |

OTHER PUBLICATIONS

International Search Report: mailed Oct. 18, 2012; PCT/CN2012/078966.
International Preliminary Report on Patentability dated Jan. 28, 2014; PCT/CN2012/078966.
First Chinese Office Action dated Jan. 28, 2014, Appln. No. 201110207503.2.
Second Chinese Office Action dated Jul. 10, 2014; Appln. No. 201110207503.2.
Third Chinese Office Action dated Oct. 28, 2014; Appln. No. 201110207503.2.

*Primary Examiner* — Timothy L Rude
(74) *Attorney, Agent, or Firm* — Ladas & Parry LLP

(57) ABSTRACT

The embodiments of the present invention disclose an array substrate and manufacturing method thereof, and a display device. The array substrate provided in an embodiment of the present invention comprises: a substrate, and a gate metal layer, an active layer and a source/drain metal layer formed on the substrate; wherein, on at least one side of the gate metal layer, there is formed an isolation buffer layer, and/or, on at least one side of the source/drain metal layer, there is formed an isolation buffer layer; furthermore, the isolation buffer layer is made of molybdenum oxide.

17 Claims, 6 Drawing Sheets

(56) References Cited

U.S. PATENT DOCUMENTS

| | | | |
|---|---|---|---|
| 7,554,260 B2 * | 6/2009 | Sakakura et al. | 313/503 |
| 7,816,721 B2 * | 10/2010 | Yamazaki et al. | 257/306 |
| 8,040,469 B2 * | 10/2011 | Nakamura et al. | 349/106 |
| 2005/0263756 A1 | 12/2005 | Yatsunami et al. | |
| 2007/0196962 A1 | 8/2007 | Morisue et al. | |
| 2008/0239217 A1 * | 10/2008 | Inoue et al. | 349/114 |
| 2009/0002623 A1 * | 1/2009 | Oda et al. | 349/147 |
| 2009/0004772 A1 | 1/2009 | Jinbo et al. | |

* cited by examiner

ARRAY SUBSTRATE, MANUFACTURING METHOD THEREOF, LIQUID CRYSTAL PANEL, AND DISPLAY DEVICE

CROSS REFERENCE TO RELATED APPLICATIONS

This application is a national stage application under 35 U.S.C. 371 and claims the benefit of PCT Application No. PCT/CN2012/078966 having an international filing date of Jul. 20, 2012, which designated the United States, which PCT application claimed the benefit of Chinese Application No. 201110207503.2 filed Jul. 22, 2011, the disclosure of each of which are incorporated herein by reference.

TECHNICAL FIELD

Embodiments of the present invention relate to an array substrate and a manufacturing method thereof, an liquid crystal panel and a display device.

BACKGROUND

The existing usual display devices include a variety of displays such as liquid crystal displays, electronic paper, OLED (Organic Light-Emitting Diode) displays, and the like.

Taking an liquid crystal display as an example, in a TFT (thin film transistor) structure which acts as a switching element of the liquid crystal display, a gate electrode and source/drain electrodes, as metal electrodes of an array substrate, need to have good characteristics, such as low electric resistance, good adhesion to a substrate and other film layers (such as a-Si (amorphous silicon) layer and doped amorphous silicon layer), no occurrence of ions diffusion in an a-Si layer, low contact resistance value for a pixel electrode layer, being easy to be etched, no hillocks generated in a CVD (Chemical Vapor Deposition) film formation process, being difficult to be oxidized, and so on.

In the early stage of the industry of thin film transistor liquid crystal displays (TFT-LCD), main materials used for metal electrode wiring are metals with a high melting point, such as chromium (Cr), molybdenum (Mo), and tantalum (Ta), etc.

With increase of the size of an LCD panel, it is required to reduce electric resistance of metal electrodes. Therefore, aluminum (Al) metal has been widely applied. But hillock phenomena are prone to occur during processing and Al ions tend to diffuse to an a-Si layer, thus aluminum alloy, such as Al—Nd, Al—Ce, and Al—Nd—Mo, etc., are used instead of pure aluminum.

As LCD panels become to have larger sizes and require high-speed driving and high resolution (4 k*2 k), copper (Cu) metal having lower electric resistance is gradually used for metal electrodes in a TFT structure.

During realization of the above-described TFT structure of an liquid crystal display, the inventors noted that the existing technologies have at least the following problems: 1) Cu has very low adhesion to a substrate, and thus is easy to be stripped off; and 2) when Cu contacts with an a-Si or N+ a-Si thin film layer, Cu ions tend to diffuse to the Si based thin films, thereby affecting conduction performance of the TFT structure.

SUMMARY

Embodiments of the present invention provide an array substrate and manufacturing method thereof, an liquid crystal panel and a display device, which are used for effectively preventing metal ions of a metal electrode layer in a TFT structure from diffusing to an active layer such as Si based thin film layer, and also increasing adhesion force between a metal electrode layer and a substrate.

One aspect of the present invention provides an array substrate, which comprises: a substrate, and a gate metal layer, an active layer and a source/drain metal layer that are formed on the substrate; wherein on at least one side of the gate metal layer in a thickness direction, there is formed an isolation buffer layer, and/or, on at least one side of the source/drain metal layer in a thickness direction, there is formed an isolation buffer layer; furthermore, the isolation buffer layer is made of molybdenum oxide.

Another aspect of the present invention provides a method for manufacturing the above-described array substrate, which comprises:

forming a gate metal layer, an active layer and a source/drain metal layer on a base substrate; and on at least one side of the gate metal layer, forming an isolation buffer layer with the same pattern as the gate metal layer; and/or, on at least one side of the source/drain metal layer, forming an isolation buffer layer with the same pattern as the source/drain metal layer; wherein, the isolation buffer layer is made of molybdenum oxide.

Still another aspect of the present invention provides a liquid crystal panel, which comprises: a color filter substrate and an array substrate that are disposed opposite to each other, and a liquid crystal layer sandwiched between the color filter substrate and the array substrate; wherein, the array substrate adopts the above-described array substrate.

Further another aspect of the present invention provides a display device, which employs the above-described array substrate.

Embodiments of the present invention provide an array substrate and manufacturing method thereof, an liquid crystal panel and a display device by using molybdenum oxide as a manufacturing material for an isolation buffer layer, and a new way to realize an isolation buffer layer is provided; moreover, an isolation buffer layer containing molybdenum oxide not only can effectively prevent metal ions of a metal electrode layer in the TFT structure from diffusing to an active layer such as a Si based thin film layer, but also can increase adhesion force between a metal electrode layer and a substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
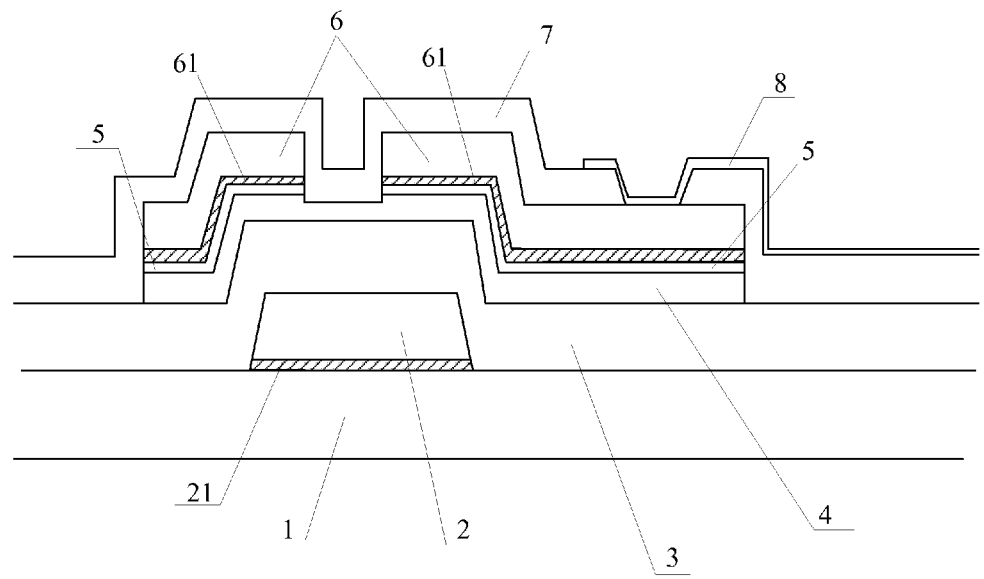
FIG. 1 is a schematic structural view of the array substrate in the first embodiment of the present invention.

Reference numerals: 1—substrate; 2—gate metal layer; 21—first isolation buffer layer; 22—third isolation buffer layer; 3—gate insulating layer; 4—semiconductor layer; 5—ohmic contact layer; 6—source/drain metal layer; 61—second isolation buffer layer; 62—fourth isolation buffer layer; 7—passivation layer; 8—pixel electrode; 9—active layer.

DETAILED DESCRIPTION

At present, in manufacturing processes of an array substrate, there exists the following problems when Cu metal is used for wirings: 1. A Cu surface has hydrophobicity, which is easy to result in photoresist residues; 2. Cu is easy to be corroded by photoresist stripper; 3. Cu has very low adhesion to a substrate or an insulating film layer, therefore is easy to be stripped off; 4. Cu is prone to be oxidized, and oxides formed on the surface will increase electric resistance; 5. when Cu contacts with a substrate or an a-Si thin film, Cu ions tend to diffuse to Si based thin films, and silicides are formed in a CVD process used for depositing a SiNx insulating thin film; 6. When hydrogen peroxides are used as a main oxidant, it is difficult to control a decomposition reaction, whereas when ethylene oxides are used as a main oxidant, the etching speed is very slow; 7. The required etchants and etching rates between Cu and an additive metal or a buffer metal is different, thus it is difficult to control the etching process.

In view of the above problems, the embodiments of the present invention provide a new way to realize an isolation buffer layer of a metal (e.g. Cu) electrode.

An embodiment provides an array substrate, which comprises: a base substrate, as well as a gate metal layer, an active layer and a source/drain metal layer that are formed on the base substrate; on at least one side of the gate metal layer (in a thickness direction), there is formed an isolation buffer layer, and/or, on at least one side of the source/drain metal layer (in the thickness direction), there is formed an isolation buffer layer; furthermore, the isolation buffer layer is made of MoOx (molybdenum oxide). For example, MoOx may be molybdenum trioxide ($MoO_3$), molybdenum dioxide ($MoO_2$), or an combination of the aforesaid materials.

In the above-described array substrate, the active layer may comprise a semiconductor layer and an ohmic contact layer, or the active layer only comprises a semiconductor layer, thus a specific realization of the active substrate may be determined in combination with different structures of the array substrate.

If the above-described array substrate adopts a bottom-gate TFT structure, then the at least one side of the gate metal layer may comprise: one side of the gate metal layer adjacent to the substrate and/or one side of the gate metal layer adjacent to a gate insulating layer; and the at least one side of the source/drain metal layer may comprise: one side of the source/drain metal layer adjacent to the active layer and/or one side of the source/drain metal layer adjacent to a passivation layer.

If the above-described array substrate adopts a top-gate TFT structure, then the at least one side of the gate metal layer may comprise: one side of the gate metal layer adjacent to a passivation layer and/or one side of the gate metal layer adjacent to a gate insulating layer; and the at least one side of the source/drain metal layer may comprise: one side of the source/drain metal layer adjacent to the active layer and/or one side of the source/drain metal layer adjacent to a gate insulating layer.

In the lattice structure of a MoOx material, oxygen atoms fills in the grain boundaries of Mo atoms, so that the lattice structure of the MoOx material is more compact compared with the original Mo metal lattice structure, which can improve adhesion force to a substrate, and effectively prevent metal ions of the gate metal layer and the source/drain metal layer from diffusing to such as a Si based thin film layer used for the active layer.

Accordingly, in another embodiment of the present invention, there is further provided a method for manufacturing the above-described array substrate, the method comprises:

Step A, on at least one side of the gate metal layer, forming an isolation buffer layer with the same pattern as the gate metal layer; and/or Step B, on at least one side of the source/drain metal layer, forming an isolation buffer layer with the same pattern as the source/drain metal layer; and the isolation buffer layer is made of a MoOx material.

In the above solution, by using molybdenum oxide as a manufacturing material for an isolation buffer layer, a new way to realize an isolation buffer layer is provided; moreover, an isolation buffer layer containing molybdenum oxide not only can effectively prevent metal ions of a metal electrode layer in the TFT structure from diffusing to an active layer such as a Si based thin film layer, but also can increase adhesion force between a metal electrode layer and an adjacent film layer.

Below, the technical schemes in the embodiments of the present invention will be fully and clearly described in conjunction with the accompanying drawings thereof. Apparently, the embodiments described are only part of the embodiments of the present invention, not the all embodiments. Based on the embodiments of the present invention, all other embodiments obtained by the ordinary skilled in the art without making creative work, belong to the protection scope of the present invention.

In the following embodiments, a bottom-gate and a stop-gate TFT structures are taken as examples to illustrate specific structural realizations of the array substrate provided by the present invention, and the active layer in the TFT structure may exemplarily adopt a traditional combination of a semiconductor layer and an ohmic contact layer. In order to reduce electric resistance of wirings, the gate metal layer and the source/drain metal layer in the TFT structures in the embodiments of the present invention, may use, but not limited to, Cu metal, Al or AlNd alloy and the like in manufacturing.

FIRST EMBODIMENT

As shown in FIG. 1, the array substrate provided in this embodiment of the present invention comprises: a base substrate 1, as well as a gate metal layer 2, a gate insulating layer 3, a semiconductor layer 4, an ohmic contact layer 5, a source/drain metal layer 6, a passivation layer 7 and a pixel electrode 8 that are formed on the base substrate 1. A first isolation buffer layer 21 is formed between the gate metal layer 2 and the base substrate 1, and a second isolation buffer layer 61 is formed between the ohmic contact layer 5 and the source/drain metal layer 6.

The base substrate 1 may be, but not limited to, a glass substrate or a quartz substrate.

The gate metal layer 2 and the source/drain metal layer 6 in this embodiment exemplarily use Cu metal, but other appropriate metal or alloy material also may be used.

The gate insulating layer 3 adopts, but not limited to, a Si based material such as $Si_xN_y$ (silicon nitride) or $Si_xO_y$ (silicon oxide), etc.

The semiconductor layer 4 and the ohmic contact layer 5 are combined to form the active layer. The semiconductor layer 4 may use a-Si (amorphous silicon) material in manufacturing; and the ohmic contact layer 5 may use N+ a-Si (doped amorphous silicon) material in manufacturing.

The passivation layer 7 may use organic resin materials or Si based materials such as $Si_xN_y$ or $Si_xO_y$, etc.

The pixel electrode 8 may use a transparent conductive material such as ITO (indium tin oxide) or IZO (indium zinc oxide).

At least one of the first isolation buffer layer 21 and the second isolation buffer layer 61 is made of MoOx.

Correspondingly, in this embodiment, there is also provided a method in manufacturing the array substrate as shown in FIG. 1.

With reference to FIGS. 2A-2D, the method for manufacturing the array substrate comprises the following steps.

Figure 2A:
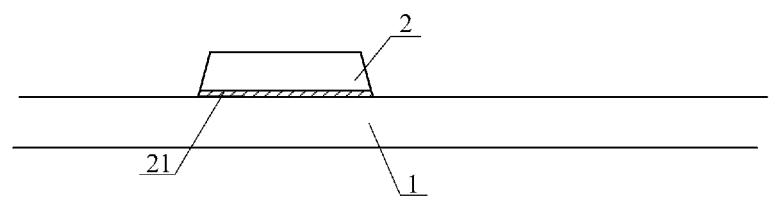
FIGS. 2A-2D are schematic views of a manufacturing process of the array substrate shown in FIG. 1.

S11, depositing a MoOx thin film and a Cu metal thin film in order on the base substrate 1, and forming patterns of the first isolation buffer layer 21 and the gate metal layer 2 through a patterning process (as shown in FIG. 2A).

The pattern of the first isolation buffer layer 21 and the pattern of the gate metal layer 2 correspond to each other up and down in the TFT structure of the array substrate, and are kept in accordance with each other in shape.

For example, the process of depositing a MoOx thin film on the base substrate may be realized in one of the following ways.

The Way A: through a sputtering process, using a mixture of Ar (argon) and $O_2$, to sputter a metal Mo target so as to form a single layer of MoOx thin film.

The Way B: through a sputtering process, first using pure Ar gas to sputter a Mo target, then using a mixture of Ar and $O_2$ to perform a secondary sputtering to the Mo target, thereby forming a dual-layer structure containing simultaneously a Mo metal layer and a MoOx thin film.

The Way C: through a sputtering process, forming a metal Mo thin film on the base substrate, then through a heat-treatment in an oxygen-enriched environment in a furnace, a bake oven, an RTP (Rapid Thermal Processing) equipment, an RTA (Rapid Thermal Annealing) equipment, a CVD equipment or a PVD (Physical Vapor Deposition) equipment, and the like, forming a MoOx film.

The Way D: through a sputtering process, forming a metal Mo thin film on the base substrate, then through a plasma-treatment in an oxygen ($O_2$ or $N_2O$) environment in a plasma equipment, forming a MoOx film.

During the implementation processes in the above-described Way A and Way B, the proportion (volume ratio) of $O_2$ in the mixture gas of Ar and $O_2$ is optimally below 50%.

During the implementation processes in the above-described Way C and Way D, the processing temperature in the heat-treatment or the plasma-treatment can be controlled within 200° C.~700° C.

Figure 2B:
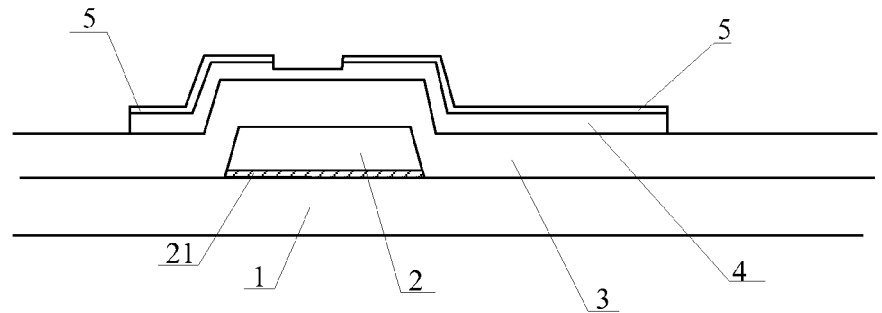

S12, depositing a gate insulating layer material, a semiconductor layer material and an ohmic contact layer material on the base substrate which has a gate metal layer formed thereon, and forming patterns of the gate insulating layer 3, the semiconductor layer 4 and the ohmic contact layer 5 through a patterning process (as shown in FIG. 2B).

Figure 2C:
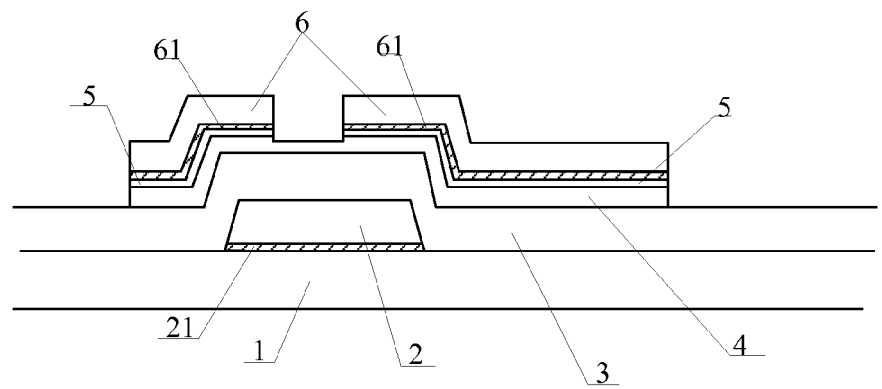

S13, depositing a MoOx thin film and a Cu metal thin film on the base substrate which has an ohmic contact layer formed thereon, and forming patterns of the second isolation buffer layer 61 and the source/drain metal layer 6 through a patterning process (as shown in FIG. 2C).

The pattern of the second isolation buffer layer 61 and the pattern of the source/drain metal layer 6 correspond to each other up and down in the TFT structure of the array substrate, and are kept in accordance with each other in shape.

In this step, the way of forming a MoOx thin film layer is the same as the way of implementation mentioned in step S11, which is no longer described here.

Figure 2D:
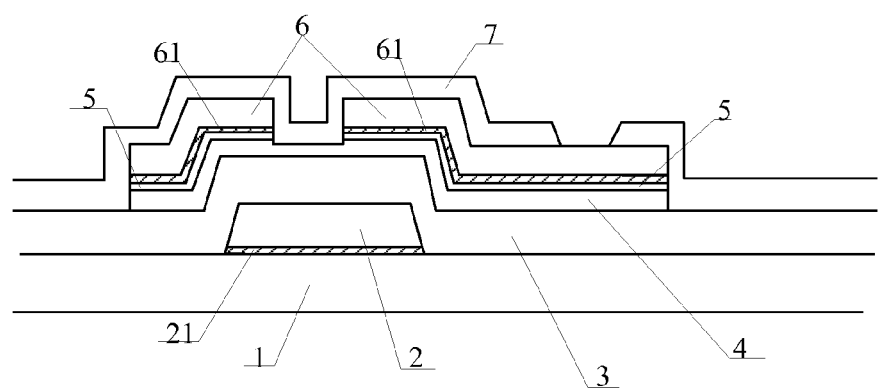

S14, depositing a passivation layer material on the base substrate which has a source/drain metal layer formed thereon, and forming a pattern of the passivation layer 7 through a patterning process (as shown in FIG. 2D);

If the passivation layer uses $Si_xN_y$ and/or $Si_xO_y$, then the passivation layer may have a thickness of 1000 Å~6000 Å, so as to avoid the case that the deposited film layer is too thick to cause a compactness problem and will in turn lead to bad results such as film peeling; if the passivation layer uses an organic resin material, then the passivation layer may have a thickness of 10000 Å~40000 Å, and a passivation layer having a comparatively larger thickness can reduce the coupling capacitance between a pixel electrode and a signal electrode, thereby reducing electricity leakage of the pixel electrode as well as crosstalk with the signal electrode.

S15, depositing a pixel electrode material on the base substrate which has a passivation layer formed thereon, and forming a pattern of the pixel electrode 8 through a patterning process (as shown in FIG. 1).

A pattering process mentioned in this embodiment and in subsequent embodiments, may comprise processes of photoresist coating, pre-baking, exposing with a mask, developing, etching, photoresist removing, and etc.

The above-described processes of manufacturing an array substrate uses exemplarily a 5-Mask procedure to illustrate the solution provided by the present invention, and certainly, the solution provided by the present invention may also be applied to a 4-Mask procedure; a half-exposing process may be used to accomplish at the same time the above-described steps S12 and S13 in one exposing process with a mask, of which the specific procedure is no longer described here.

The array substrate and the manufacturing method thereof, provided by this embodiment of the present invention, offer a new way to realize an isolation buffer layer by using MoOx as a manufacturing material for the isolation buffer layer; moreover, the isolation buffer layer containing molybdenum oxide not only can effectively prevent metal ions of a metal electrode layer in the TFT structure from diffusing to an active layer such as a Si based thin film layer, but also can increase an adhesion force between the metal electrode layer and a base substrate.

SECOND EMBODIMENT

Based on the array substrate provided by the first embodiment, the present embodiment makes a further improvement and obtains another kind of array substrate structure.

Figure 3:
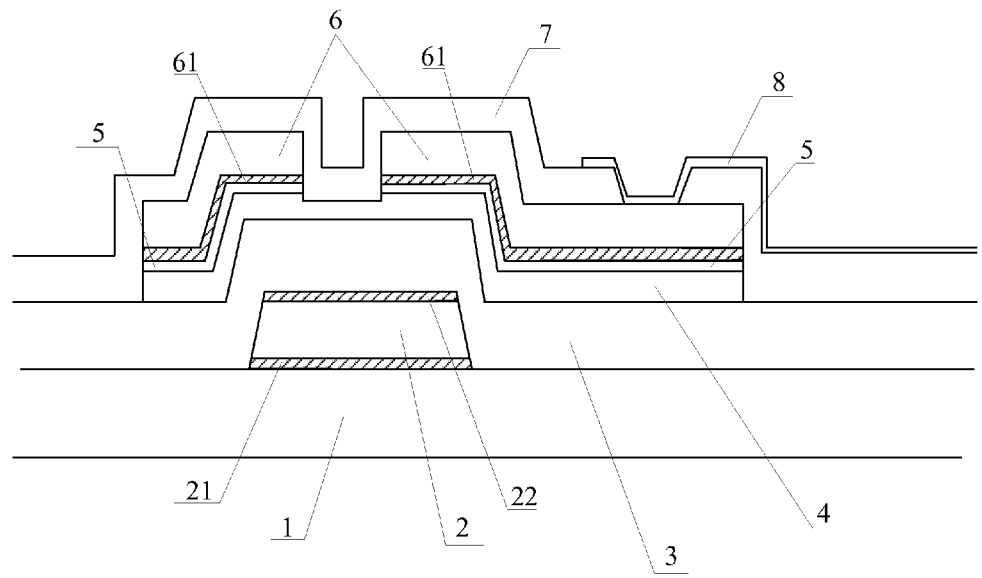
FIG. 3 is a schematic structural view of the array substrate in the second embodiment of the present invention.

As shown in FIG. 3, the another array substrate provided by the present embodiment comprises a base substrate 1, as well as a gate metal layer 2, a gate insulating layer 3, a semiconductor layer 4, an ohmic contact layer 5, a source/drain metal layer 6, a passivation layer 7 and a pixel electrode 8 that are formed on the base substrate 1. A first isolation buffer layer 21 is formed between the gate metal layer 2 and the base substrate 1, and a second isolation buffer layer 61 is formed between the ohmic contact layer 5 and the source/drain metal layer 6.

In addition, a third isolation buffer layer 22 is formed between the gate metal layer 2 and the gate insulating layer 3.

The gate metal layer 2 and the source/drain metal layer 6 in this embodiment choose Cu metal, but other metals also may be used.

The first isolation buffer layer 21 and/or the second isolation buffer layer 61 may be made of MoOx. The third isolation buffer layer 22 may be made of metal Mo or MoOx.

In this embodiment, there is also provided a method for manufacturing the array substrate as shown in FIG. 3; the specific implementation procedure of the method is similar to the manufacturing procedure of the array substrate shown in FIG. 1, with difference in that: in step S11, a MoOx thin film, a Cu metal thin film, and a metal Mo or MoOx thin film are deposited in order on the base substrate 1, and the patterns of the first isolation buffer layer 21, the gate metal layer 2 and the third isolation buffer layer 22 are formed through a patterning process.

The patterns of the first isolation buffer layer 21, the gate metal layer 2 and the third isolation buffer layer 22 correspond to each other up and down in the TFT structure of the array substrate, and are kept in accordance with each other in shape.

The array substrate and the manufacturing method thereof provided by this embodiment, based on the first embodiment, additionally provide an isolation buffer layer between the gate metal layer and the gate insulating layer, which can further enhance the adhesion force between the gate metal layer and the gate insulating layer so as to prevent the gate metal layer and the gate insulating layer from being stripped off, and at the same time prevent Cu ions in the gate metal layer from diffusing to the gate insulating layer.

THIRD EMBODIMENT

Based on the array substrate provided by the first embodiment, the present embodiment makes a further improvement, and provides another kind of array substrate structure.

Figure 4:
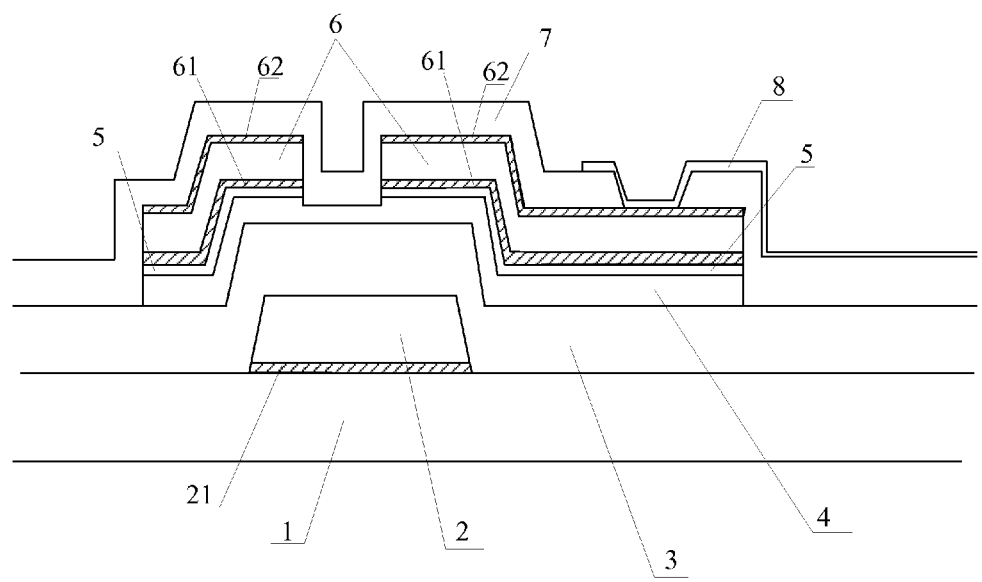
FIG. 4 is a schematic structural view of the array substrate in the third embodiment of the present invention.

As shown in FIG. 4, the another array substrate provided by the present embodiment, comprises: a base substrate 1, as well as a gate metal layer 2, a gate insulating layer 3, a semiconductor layer 4, an ohmic contact layer 5, a source/drain metal layer 6, a passivation layer 7 and a pixel electrode 8 that are formed on the base substrate 1. A first isolation buffer layer 21 is formed between the gate metal layer 2 and the base substrate 1, and a second isolation buffer layer 61 is formed between the ohmic contact layer 5 and the source/drain metal layer 6; in addition, a fourth isolation buffer layer 62 is formed between the source/drain metal layer 6 and the passivation layer 7.

The gate metal layer 2 and the source/drain metal layer 6 in this embodiment choose, but not limited to, Cu metal.

The first isolation buffer layer 21 and/or the second isolation buffer layer 61 may be made of MoOx; the fourth isolation buffer layer 62 may be made of metal Mo or MoOx.

In this embodiment, there is also provided a method for manufacturing the array substrate shown in FIG. 4; the specific implementation procedure of the method is similar to the manufacturing procedure of the array substrate shown in FIG. 1, with difference in that: in step S13, a MoOx thin film, a Cu metal thin film and a metal Mo or MoOx thin film are deposited on the base substrate which has an ohmic contact layer formed thereon, and the patterns of the second isolation buffer layer 61, the source/drain metal layer 6 and the fourth isolation buffer layer 62 are formed through a patterning process.

The patterns of the second isolation buffer layer 61, the source/drain metal layer 6 and the fourth isolation buffer layer 62 correspond to each other up and down in the TFT structure of the array substrate, and are kept in accordance with each other in shape.

The array substrate and the manufacturing method thereof provided by this embodiment, based on the first embodiment, additionally provide an isolation buffer layer between the source/drain metal layer and the passivation layer, which can further enhance the adhesion force between the source/drain metal layer and the passivation layer so as to prevent the source/drain metal layer and the passivation layer from being stripped off, and effectively reduce the contact resistance between a pixel electrode and Cu in the source/drain metal layer and prevent Cu metal from being oxidized.

FOURTH EMBODIMENT

In this embodiment, the scheme in the second embodiment and the scheme in the third embodiment are combined, so that another new kind of array substrate structure is provided.

Figure 5:
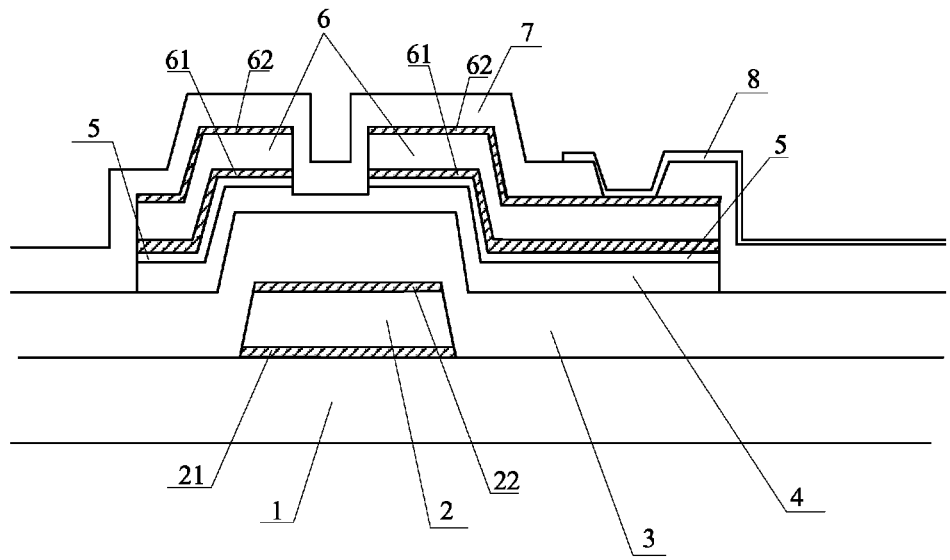
FIG. 5 is a schematic structural view of the array substrate in the fourth embodiment of the present invention.

As shown in FIG. 5, the another new array substrate provided by the present embodiment comprises: a base substrate 1, as well as a gate metal layer 2, a gate insulating layer 3, a semiconductor layer 4, an ohmic contact layer 5, a source/drain metal layer 6, a passivation layer 7 and a pixel electrode 8 that are formed on the base substrate 1. A first isolation buffer layer 21 is formed between the gate metal layer 2 and the base substrate 1, and a second isolation buffer layer 61 is formed between the ohmic contact layer 5 and the source/drain metal layer 6. In addition, a third isolation buffer layer 22 is formed between the gate metal layer 2 and the gate insulating layer 3, and a fourth isolation buffer layer 62 is formed between the source/drain metal layer 6 and the passivation layer 7.

The gate metal layer 2 and the source/drain metal layer 6 in this embodiment choose, but not limited to, Cu metal.

The first isolation buffer layer 21 and/or the second isolation buffer layer 61 may be made of MoOx; the third isolation buffer layer 22 and/or the fourth isolation buffer layer 62 may be made of metal Mo or MoOx.

The method for manufacturing the array substrate shown in FIG. 5 may be the combination of the manufacturing methods of the array substrates provided in the second embodiment and the third embodiment, which is no longer described here.

The array substrate and the manufacturing method thereof provided by this embodiment, based on the first embodiment, additionally provide a third isolation buffer layer between the gate metal layer and the gate insulating layer, as well as a fourth isolation buffer layer between the source/drain metal layer and the passivation layer, which can further secure the inter-layer adhesion force in the TFT structure so as to prevent separation phenomenon from occurring among different layers, and effectively reduce the contact resistance between a pixel electrode and Cu in the source/drain metal layer and prevent Cu metal from being oxidized.

In all of the above-described first embodiment to the fourth embodiment, a bottom-gate TFT structure is used exemplarily to illustrate the newly-provided array substrate structures in the present invention. However, the schemes provided by the present invention may be applied, but not limited, to an array substrate with a bottom-gate TFT structure; certainly, they may also be applied to an array substrate with a top-gate or dual-gate TFT structure.

In the following, a brief introduction will be given to a top-gate TFT structure which applies a realization scheme of an isolation buffer layer provided by the present invention.

FIFTH EMBODIMENT

Figure 6:
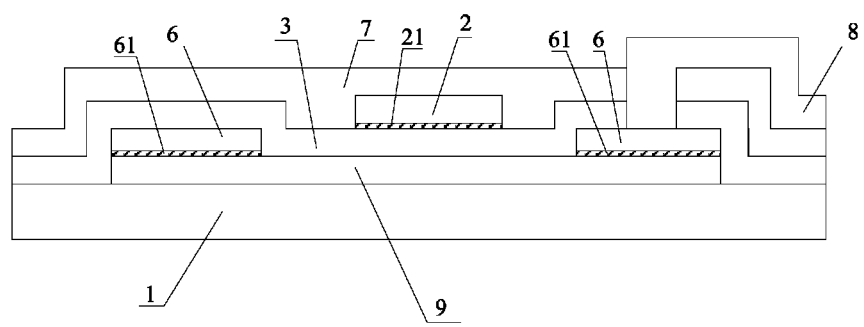
FIG. 6 is a schematic structural view of the array substrate in the fifth embodiment of the present invention.

As shown in FIG. 6, in a structure of an array substrate with top-gate TFT, an active layer 9, a source/drain metal layer 6, a gate insulating layer 3, a gate metal layer 2, a passivation layer 7 and a pixel electrode 8 are formed in order on a base substrate 1. The active layer 9 may be in a single layer structure which comprises only a semiconductor layer, also may be in a dual-layer structure which comprises both a semiconductor layer and an ohmic contact layer. In the TFT array substrate structure as shown in FIG. 6, the specific implementations of the active layer 9 are no longer distinguished, but not limited to a single-layer structure.

In the structure of the top-gate TFT array substrate described above, a first isolation buffer layer 21 is formed between the gate metal layer 2 and the gate insulating layer 3, and a second isolation buffer layer 61 is formed between the active layer 9 and the source/drain metal layer 6; and, the first isolation buffer layer 21 and/or the second isolation buffer layer 61 may be made of MoOx.

Accordingly, the procedure of manufacturing the array substrate shown in FIG. 6, comprises: forming the active layer 9, the source/drain metal layer 6, the gate insulating layer 3 and the gate metal layer 2, as well as the passivation layer 7 and the pixel electrode 8 in order on the base substrate 1.

The second isolation buffer layer 61 is manufactured at the same time of manufacturing the source/drain metal layer 6. Specifically, a molybdenum oxide thin film and the source/drain metal thin film are formed on the substrate which has an active layer 9 formed thereon, and the patterns of the second isolation buffer layer 61 and the source/drain metal layer 6, which have same patterns, are formed through a patterning process.

The first isolation buffer layer 21 is manufactured at the same time of manufacturing the gate metal layer 2. Specifically, a molybdenum oxide thin film and the gate metal thin film are formed on the substrate which has an gate insulating layer 3 formed thereon, and the patterns of the first isolation buffer layer 21 and the gate metal layer 2, which have same patterns, are formed through a patterning process.

During the manufacturing procedure of the above-described array substrate, the depositing processes for forming a MoOx thin film are similar to the first embodiment, which is no longer described here.

The array substrate and the manufacturing method thereof provided by this embodiment offer a new way to realize an isolation buffer layer by using MoOx as a manufacturing material for the isolation buffer layer; moreover, the isolation buffer layer containing molybdenum oxide not only can effectively prevent metal ions of a metal electrode layer in the TFT structure from diffusing to an active layer such as a Si based thin film layer, but also can increase an adhesion force between the metal electrode layer and an adjacent film layer so as to prevent the metal electrode layer from occurring separation.

SIXTH EMBODIMENT

Based on the array substrate provided by the fifth embodiment, the present embodiment makes a further improvement and provides another structure of a top-gate TFT array substrate.

Figure 7:
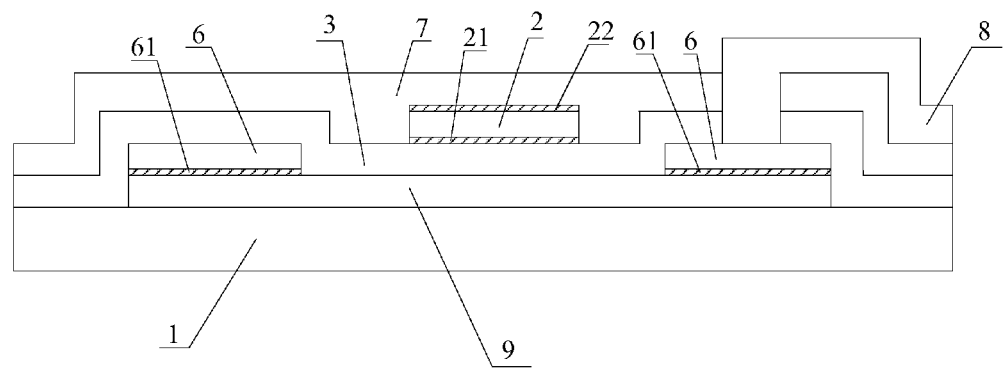
FIG. 7 is a schematic structural view of the array substrate in the sixth embodiment of the present invention.

As shown in FIG. 7, besides the structure described in the fifth embodiment, the array substrate in this embodiment further comprises a third isolation buffer layer 22 which is formed between the gate metal layer 2 and the passivation layer 7, and the third isolation buffer layer 22 may be made of metal Mo or MoOx.

Accordingly, in the manufacturing procedure of the array substrate shown in FIG. 7, the first isolation buffer layer 21, the third isolate buffer layer 22 and the gate metal layer 2 are manufactured by using a same mask (exposing) process; specifically, a molybdenum oxide thin film, a gate metal thin film, as well as a metal molybdenum or molybdenum oxide thin film are deposited in order on the substrate which has a gate insulating layer 3 formed thereon, and the patterns of the first isolation buffer layer 21, the gate metal layer 2 and the third isolate buffer layer 22 are formed through a patterning process.

The array substrate and the manufacturing method thereof, provided by this embodiment, offer a new way to realize an isolation buffer layer by using MoOx as a manufacturing material for the isolation buffer layer; moreover, the isolation buffer layer containing molybdenum oxide not only can effectively prevent metal ions of a metal electrode layer in the TFT structure from diffusing to an active layer such as a Si based thin film layer, but also can increase an adhesion force between the metal electrode layer and an adjacent film layer so as to prevent the metal electrode layer from occurring separation.

SEVENTH EMBODIMENT

Based on the array substrate provided by the fifth embodiment, the present embodiment makes a further improvement and provides another structure of a top-gate TFT array substrate. Specifically, As shown in FIG. 8, besides the structure described in the fifth embodiment, the array substrate in this embodiment further comprises a fourth isolation buffer layer 62 which is formed between the gate insulating layer 3 and the source/drain metal layer 6, and the fourth isolation buffer layer 62 is made of metal Mo or MoOx.

Figure 8:
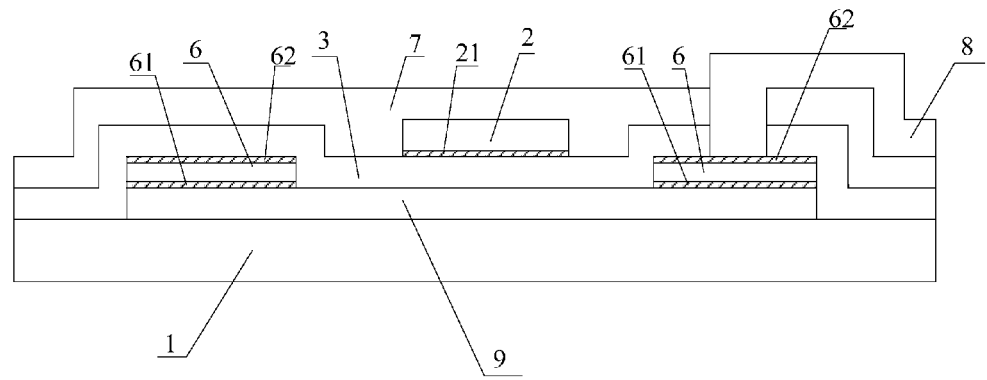
FIG. 8 is a schematic structural view of the array substrate in the seventh embodiment of the present invention.

Accordingly, in the manufacturing procedure of the array substrate as shown in FIG. 8, the second isolation buffer layer 61 and the fourth isolate buffer layer 62 may both be manufactured along with the source/drain metal layer 6 by using a same mask process; specifically, a molybdenum oxide thin film, a source/drain metal thin film, as well as a metal molybdenum or molybdenum oxide thin film are deposited in order on the base substrate which has an active layer 9 formed thereon, and the patterns of the second isolation buffer layer 61, the source/drain metal layer 6 and the fourth isolate buffer layer 62, which have the same patterns, are formed through a patterning process.

The array substrate and the manufacturing method thereof, provided by this embodiment, can further enhance the adhesion force between the source/drain metal layer and the gate insulating layer so as to prevent the source/drain metal layer and the gate insulating layer from occurring separation, and effectively reduce the contact resistance between a pixel electrode and Cu in the source/drain metal layer and prevent Cu metal from being oxidized.

EIGHTH EMBODIMENT

In this embodiment, the scheme in the sixth embodiment and the scheme in the seventh embodiment may be combined together, so that another new array substrate structure is obtained.

Figure 9:
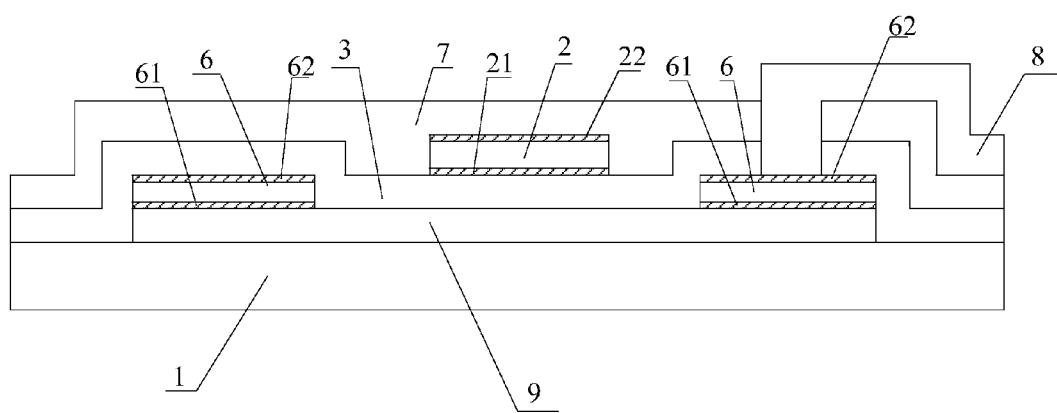
FIG. 9 is a schematic structural view of the array substrate in the eighth embodiment of the present invention.

As shown in FIG. 9, besides the structure described in the fifth embodiment, the array substrate provided in this embodiment further comprises: a third isolation buffer layer 22 which is formed between the gate metal layer 2 and the passivation layer 7, and a fourth isolation buffer layer 62 which is formed between the gate insulating layer 3 and the source/drain metal layer 6; moreover, the third isolation buffer layer 22 and the fourth isolation buffer layer 62 are made of metal Mo or MoOx.

The manufacturing method of the array substrate shown in FIG. 9 may be the combination of the manufacturing methods of the array substrates provided in the sixth embodiment and the seventh embodiment, which is no longer described here.

The array substrate and the manufacturing method thereof provided by this embodiment, can further secure the interlayer adhesion force in the TFT structure so as to prevent separation phenomenon from occurring among different layers, and effectively reduce the contact resistance between a pixel electrode and Cu in the source/drain metal layer and prevent Cu metal from being oxidized.

In an embodiments of the present invention, there is also provided a liquid crystal panel, which comprises: a color filter substrate and an array substrate that are disposed opposite to each other, and a liquid crystal layer sandwiched between the color filter substrate and the array substrate; the array substrate may utilize the array substrate provided in the above-described embodiments.

In the embodiments of the present invention, there is further provided a display device, in which the array substrate provided in the above-described embodiments is used.

The above-described display device may be, but not limited to, a liquid crystal display device, and also may be an OLED display device, an e-book and the like display device.

Since the liquid crystal panel and the display device in the embodiments of the present invention adopt the array substrate provided in the above-described embodiments, thus the same technical effects as mentioned in the above embodiments can be achieved.

The schemes provided in the present invention apply not only to various display devices which use TFT array substrates but also apply to X-ray detector devices.

The above description is only the specific implementation of the present invention, and the protection scope of the present invention is not limited to that. In the technical range disclosed by the present invention, variations and alterations which can be easily conceived by any skilled who is familiar with the art, should be included within the protection scope of the present invention. Therefore, the protection scope of the present invention should be defined by the protection scope of the claims.

The invention claimed is:

1. An array substrate, comprising a base substrate, as well as a gate metal layer, an active layer and a source/drain metal layer that are formed on the base substrate; wherein, on at least one side of the gate metal layer in a thickness direction, there is formed an isolation buffer layer, and, on at least one side of the source/drain metal layer in a thickness direction, there is formed an isolation buffer layer; and the isolation buffer layers are made of molybdenum oxide.

2. The array substrate according to claim 1, wherein the array substrate adopts a bottom-gate structure, and a gate insulating layer is formed between the gate metal layer and the active layer;
on at least one side of the gate metal layer, there is formed an isolation buffer layer, which comprises: a first isolation buffer layer is formed between the gate metal layer and the base substrate; or, a first isolation buffer layer is formed between the gate metal layer and the base substrate, and a third isolation buffer layer is formed between the gate metal layer and the gate insulating layer;
wherein, the first isolation buffer layer is made of molybdenum oxide, and the third isolation buffer layer is made of metal molybdenum or molybdenum oxide.

3. The array substrate according to claim 2, wherein, the array substrate adopts a bottom-gate structure, and a passivation layer is formed above the source/drain metal layer;
on at least one side of the source/drain metal layer, there is formed an isolation buffer layer, which comprises: a second isolation buffer layer made of molybdenum oxide is formed between the active layer and the source/drain metal layer; or a second isolation buffer layer made of molybdenum oxide is formed between the active layer and the source/drain metal layer, and a fourth isolation buffer layer is formed between the passivation layer and the source/drain metal layer, and the fourth isolation buffer layer is made of metal molybdenum or molybdenum oxide.

4. The array substrate according to claim 1, wherein the array substrate adopts a top-gate structure, and the array substrate further comprises a gate insulating layer formed between the gate metal layer and the active layer, and a passivation layer formed above the gate metal layer;
on at least one side of the gate metal layer, there is formed an isolation buffer layer, which comprises: a first isolation buffer layer is formed between the gate metal layer and the gate insulating layer; or a first isolation buffer layer is formed between the gate metal layer and the gate insulating layer, and a third isolation buffer layer is formed between the gate metal layer and the passivation layer;
wherein the first isolation buffer layer is made of molybdenum oxide, and the third isolation buffer layer is made of metal molybdenum or molybdenum oxide.

5. The array substrate according to claim 4, wherein, the array substrate adopts a top-gate structure, and a gate insulating layer is formed between the gate metal layer and the source/drain metal layer;
on at least one side of the source/drain metal layer, there is formed an isolation buffer layer, which comprises: a second isolation buffer layer made of molybdenum oxide is formed between the active layer and the source/drain metal layer; or a second isolation buffer layer made of molybdenum oxide is formed between the active layer and the source/drain metal layer, and a fourth isolation buffer layer is formed between the gate insulating layer and the source/drain metal layer, and the fourth isolation buffer layer is made of metal molybdenum or molybdenum oxide.

6. The array substrate according to claim 1, wherein, the array substrate adopts a bottom-gate structure, and a passivation layer is formed above the source/drain metal layer;
on at least one side of the source/drain metal layer, there is formed an isolation buffer layer, which comprises: a second isolation buffer layer made of molybdenum oxide is formed between the active layer and the source/drain metal layer; or a second isolation buffer layer made of molybdenum oxide is formed between the active layer and the source/drain metal layer, and a fourth isolation buffer layer is formed between the passivation layer and the source/drain metal layer, and the fourth isolation buffer layer is made of metal molybdenum or molybdenum oxide.

7. The array substrate according to claim 1, wherein, the array substrate adopts a top-gate structure, and a gate insulating layer is formed between the gate metal layer and the source/drain metal layer;

on at least one side of the source/drain metal layer, there is formed an isolation buffer layer, which comprises: a second isolation buffer layer made of molybdenum oxide is formed between the active layer and the source/drain metal layer; or a second isolation buffer layer made of molybdenum oxide is formed between the active layer and the source/drain metal layer, and a fourth isolation buffer layer is formed between the gate insulating layer and the source/drain metal layer, and the fourth isolation buffer layer is made of metal molybdenum or molybdenum oxide.

8. The array substrate according to claim 1, wherein at least one of the source/drain metal layer and the gate metal layer is made of Cu metal or Cu alloy.

9. A method for manufacturing the array substrate according to claim 1 comprising:

forming a gate metal layer, an active layer and a source/drain metal layer on a base substrate; and on at least one side of the gate metal layer forming an isolation buffer layer with the same pattern as the gate metal layer; and/or on at least one side of the source/drain metal layer forming an isolation buffer layer with the same pattern as the source/drain metal layer;

wherein the isolation buffer layer is made of molybdenum oxide.

10. The method according to claim 9, wherein the array substrate adopts a bottom-gate structure; and on at least one side of the gate metal layer forming an isolation buffer layer with the same pattern as the gate metal layer comprises:

depositing a molybdenum oxide thin film and a gate metal thin film in order on the base substrate, and forming patterns of the gate metal layer and a first isolation buffer layer through a patterning process.

11. The method according to claim 9, wherein the array substrate adopts a bottom-gate structure; and on at least one side of the gate metal layer forming an isolation buffer layer with the same pattern as the gate metal layer comprises:

depositing a molybdenum oxide thin film, a gate metal thin film, as well as a metal molybdenum or molybdenum oxide thin film in order on the base substrate, and forming patterns of a third isolation buffer layer, the gate metal layer and a first isolation buffer layer through a patterning process.

12. The method according to claim 9, wherein the array substrate adopts a top-gate structure; and on at least one side of the gate metal layer forming an isolation buffer layer with the same pattern as the gate metal layer comprises:

depositing a molybdenum oxide thin film and a gate metal thin film in order on the base substrate which has a gate insulating layer formed thereon, and forming patterns of a first isolation buffer layer and the gate metal layer through a patterning process.

13. The method according to claim 9, wherein the array substrate adopts a top-gate structure; and on at least one side of the gate metal layer forming an isolation buffer layer with the same pattern as the gate metal layer comprises:

depositing a molybdenum oxide thin film and a gate metal thin film, as well as a metal molybdenum or molybdenum oxide thin film in order on the base substrate which has a gate insulating layer formed thereon, and forming patterns of a first isolation buffer layer, the gate metal layer and a third isolation buffer layer through a patterning process.

14. The method according to claim 9, wherein on at least one side of the source/drain metal layer forming an isolation buffer layer with the same pattern as the source/drain metal layer which comprises:

depositing a molybdenum oxide thin film and a source/drain metal thin film in order on the base substrate which has the active layer formed thereon, and forming patterns of a second isolation buffer layer and the source/drain metal layer through a patterning process.

15. The method according to claim 9, wherein, on at least one side of the source/drain metal layer forming an isolation buffer layer with the same pattern as the source/drain metal layer comprises:

depositing a molybdenum oxide thin film and a source/drain metal thin film, as well as a metal molybdenum or molybdenum oxide thin film in order on the base substrate which has the active layer formed thereon, and forming patterns of a second isolation buffer layer, the source/drain metal layer and a fourth isolation buffer layer through a patterning process.

16. The method according to claim 9, wherein the molybdenum oxide thin film is manufactured in one of the following ways:

a. through a sputtering process, using a mixture of Ar and $O_2$ to sputter a metal Mo target so as to form a single layer of MoOx thin film; or b. through a sputtering process, first using pure Ar gas to sputter a molybdenum target, then using a mixture of Ar and $O_2$ to perform a secondary sputtering to the Mo target, thereby forming a dual-layer structure containing simultaneously a Mo metal layer and a MoOx thin film; or c. through a sputtering process, forming a metal Mo thin film on the base substrate, then through heat-treatment in an oxygen-enriched environment, forming a MoOx film; or d. through a sputtering process, forming a metal Mo thin film on the base substrate, then through heat-treatment in an oxygen-enriched environment, forming a MoOx film.

17. A liquid crystal panel, comprising: a color filter substrate and an array substrate that are disposed opposite to each other, and a liquid crystal layer sandwiched between the color filter substrate and the array substrate;

wherein the array substrate utilizes the array substrate according to claim 1.

* * * * *